(12) United States Patent
Lee et al.

(10) Patent No.: US 7,019,974 B2
(45) Date of Patent: Mar. 28, 2006

(54) HEAT DISSIPATION DEVICE

(75) Inventors: Hsieh-Kun Lee, Tu-Cheng (TW); Xue-Wen Peng, Shenzhen (CN); Rui-Hua Chen, Shenzhen (CN)

(73) Assignee: Hon Hai Precision Industry Co., Ltd., (TW)

( * ) Notice: Subject to any disclaimer, the term of this patent is extended or adjusted under 35 U.S.C. 154(b) by 111 days.

(21) Appl. No.: 10/892,846

(22) Filed: Jul. 16, 2004

(65) Prior Publication Data

US 2006/0012959 A1  Jan. 19, 2006

(51) Int. Cl.
*H05K 7/20* (2006.01)

(52) U.S. Cl. ............... 361/700; 361/704; 361/719; 174/15.2; 165/80.4; 165/104.21; 257/715

(58) Field of Classification Search ............... 361/700; 174/15.2; 165/104.21; 257/715
See application file for complete search history.

(56) References Cited

U.S. PATENT DOCUMENTS

| 4,830,100 | A | * | 5/1989 | Kato et al. ............. 165/104.14 |
| 5,229,915 | A | * | 7/1993 | Ishibashi et al. ............. 361/699 |
| 5,930,115 | A | * | 7/1999 | Tracy et al. ................ 361/704 |
| 6,181,556 | B1 | | 1/2001 | Allman |
| 6,914,780 | B1 | * | 7/2005 | Shanker et al. ............. 361/687 |
| 2003/0189815 | A1 | | 10/2003 | Lee |

* cited by examiner

*Primary Examiner*—Boris Chervinsky
(74) *Attorney, Agent, or Firm*—Morris Manning & Martin; Tim Tingkang Xia, Esq.

(57) ABSTRACT

A heat dissipation device includes a first heat sink (10) mounted on one side of a video graphics adapter (VGA) card (70) on which a heat generating componnent (74) is mounted to dissipate heat generated by the heat generating componnent, a second heat sink (30) mounted on an opposite side of the card, a first heat pipe (50, 50') thermally connected to the first heat sink, a second heat pipe (60, 60') discrete from the first heat pipe thermally connected to the second heat sink, and a connecting member (80, 80') connected between the first and second heat pipes for transferring heat from the first heat pipe to the second heat pipe.

13 Claims, 6 Drawing Sheets

HEAT DISSIPATION DEVICE

TECHNICAL FIELD

The present invention relates to a heat dissipation device for electronic devices, and particularly to a heat dissipation device for an add-on card apparatus like a graphics card apparatus.

BACKGROUND

In order to enable desktop and other computers to rapidly and directly perform newly developed technology, like high-resolution graphics function, wireless communcation etc., add-on units including "graphics cards" or "video graphic array (VGA) cards" are often installed in computer devices to permit these computer devices enhancing their operative abilities. Using graphics cards as an example, such cards include a separate processor, called a graphic processing unit (GPU), one or more memory chips and other required circuitry, all mounted to a circuit board. These electronic components, especially GPU, on such cards often have extremely large computing power and, as a consequence, generate substantial heat that if not efficiently dissipated will adversely affect normal operation of the graphics cards. Thus, a heat dissipation device is often attached to a top surface of a GPU to remove heat therefrom.

Currently, heat pipe type heat dissipation devices which have good heat transfer performance have been widely used. A heat pipe is a closed, constant mass cooling system in which the working liquid coexists in equilibrium with its vapor during the normal operating status of the heat pipe. It consists of an evaporative section, in which the working liquid is heated and vaporized; an adiabatic section, in which both vapor and condensed liquid flow with no heat being externally transferred; and a condensative section, in which vapor is condensed to liquid and the released latent heat of vaporization is transferred to the external surroundings. The liquid flows via capillary action back the evaporative section. The axial flow of the vapor and the capillary flow of the returning working liquid are both produced by pressure gradients. When the heat pipe is too long, the pressure gradient of the heat pipe will be reduced accordingly. It is then difficult for working fluid in the heat pipe to return back to the evaporative section from the condensative section. Heat transfer capability of the heat pipe will be reduced.

FIG. 6 shows a conventional heat pipe type heat dissipation device mounted on a VGA card 10. The heat dissipation device comprises a first heat sink 18, a second heat sink 20, and a heat pipe 22. In assembly, the heat pipe 22 is fixed to the the first and second heat sinks 18, 20 simultaneously by soldering or other means. The combined heat sinks 18, 20 and heat pipe 22 is then attached to the card 10. The first heat sink 18 is mounted on one side of the card 10 and directly contacts a GPU (not visible) of the card 10. The second heat sink 20 is mounted on an opposite side of the card 10. The heat pipe 22 is connected between the first and second heat sinks 18, 20 for transferring heat from the first heat sink 18 to the second heat sink 20.

However, when the two heat sinks 18, 20 are fixed to the heat pipe 22, it is difficult to position the heat sinks 18, 20 to the heat pipe 22 simultaneously. Moreover, the length of this kind of heat sinks 18, 20 is usually greater than 100 mm and the length of the heat pipe 22 is consequently greater than 200 mm, which results in heat transfer capability of the heat pipe 22 reduced since it is difficult for working fluid in the heat pipe 22 to successfully circulating in the heat pipe 22 as mentioned above. Therefore, heat dissipation efficiency of the heat dissipation device is limited.

SUMMARY OF THE INVENTION

Accordingly, an object of the present invention is to provide a heat dissipation device which comprises heat sinks and heat pipes readily mounted to the heat sinks.

Another object of the present invention is to provide a heat dissipation device which can efficiently dissipate heat from electronic devices mounted on add-on cards.

To achieve the above-mentioned objects, a heat dissipation device in accordance with the present invention comprises a first heat dissipation unit provided on one side of a card in thermal contact with an electronic component of the card, a second heat dissipation unit provided on an opposite side of the card, a first heat pipe thermally connected to the first heat dissipation unit, a second heat pipe discrete from the first heat pipe thermally connected to the second heat dissipation unit, and a connecting member connected between the first and second heat pipes for transferring heat from the first heat pipe to the second heat pipe.

Other objects, advantages and novel features of the present invention will be drawn from the following detailed description of a preferred embodiment of the present invention with attached drawings, in which:

DETAILED DESCRIPTION

Figure 1:
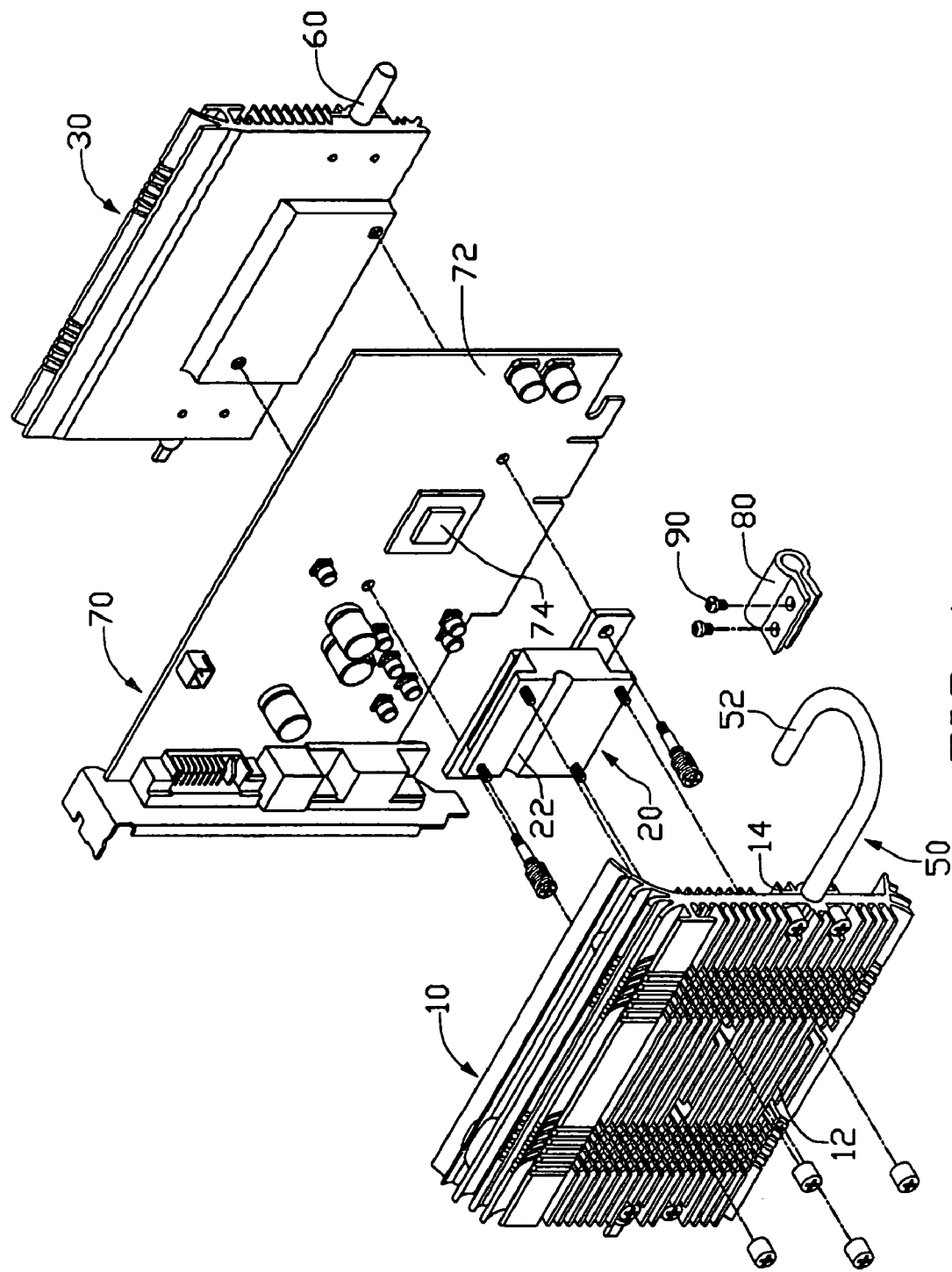
FIG. 1 is an exploded, isometric view of a heat dissipation device in accordance with a first preferred embodiment of the present invention, together with a VGA card.
Figure 2:
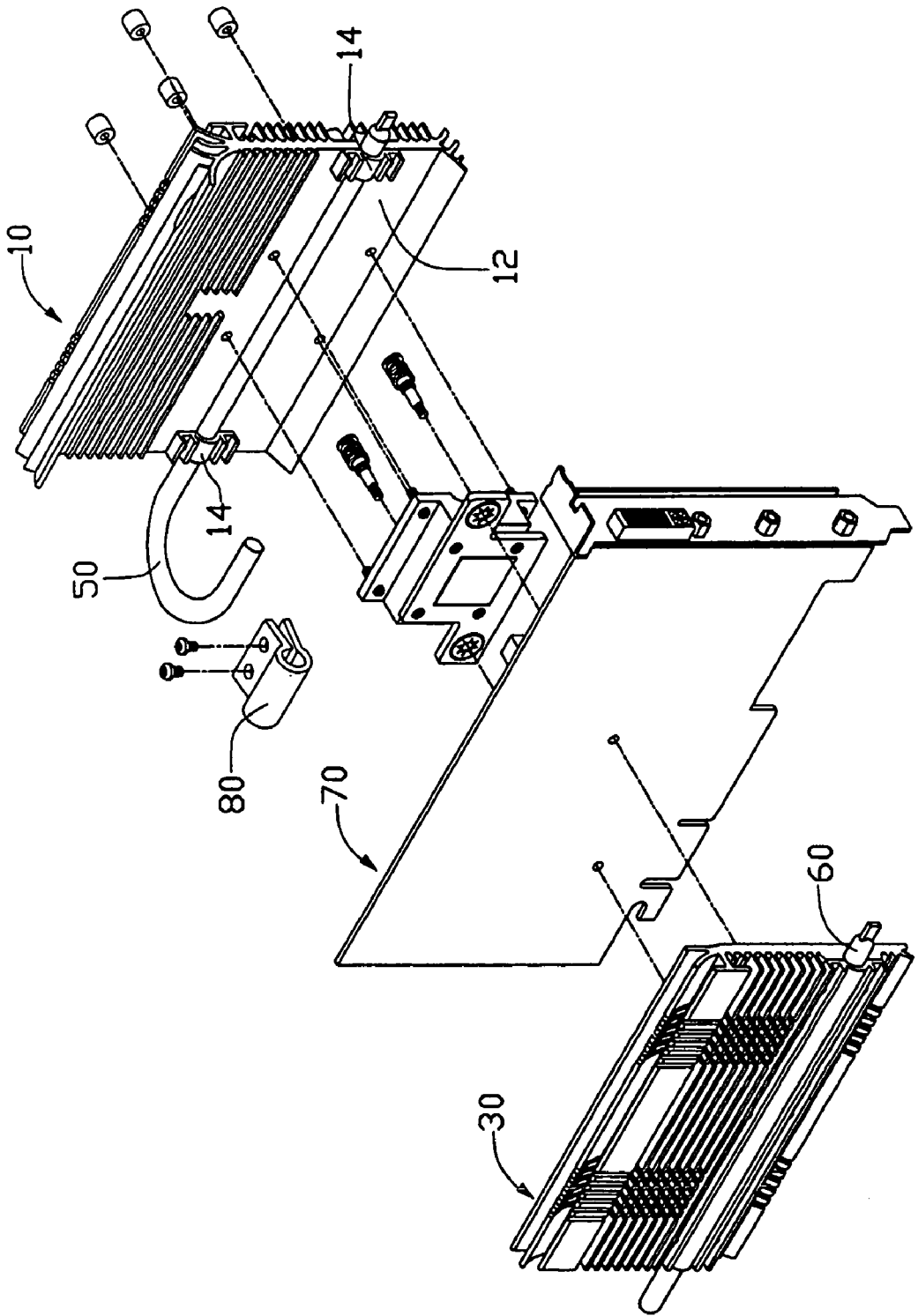
FIG. 2 is similar to FIG. 1 but viewed from another aspect.

Referring to the attached drawings, FIGS. 1–2 show a heat dissipation device of in accordance with the first preferred embodiment of the present invention and an add-on card like a video graphic array (VGA) card 70. The heat dissipation device comprises a first heat dissipation unit, a second heat dissipation unit, a first heat pipe 50, a second heat pipe 60, and a connecting member 80. The VGA card 70 comprises a circuit board 72 on one side of which a graphic processing unit (GPU) 74 is mounted.

The first heat dissipation unit comprises a first heat sink 10 and a block 20. The first heat sink 10 comprises a plurality of heat dissipation fins 12. The block 20 is attached on one side of the first heat sink 10 by screws (not labeled). A longitudinal slot 22 is defined in one surface of the block 20 facing the first heat sink 10. The first heat pipe 50 is fixedly attached to the first heat sink 10 via two clips 14, extending through the slot 22 of the block 20. The first heat pipe 50 has a generally U-shaped end portion 52 extending beyond the first heat sink 10 in a longitudinal direction thereof. The second heat dissipation unit comprises a second heat sink 30 with a plurality of heat dissipation fins. The second heat pipe 60 is linear-shaped and fixedly extends through the second heat sink 30 in a longitudinal direction thereof.

Figure 3:
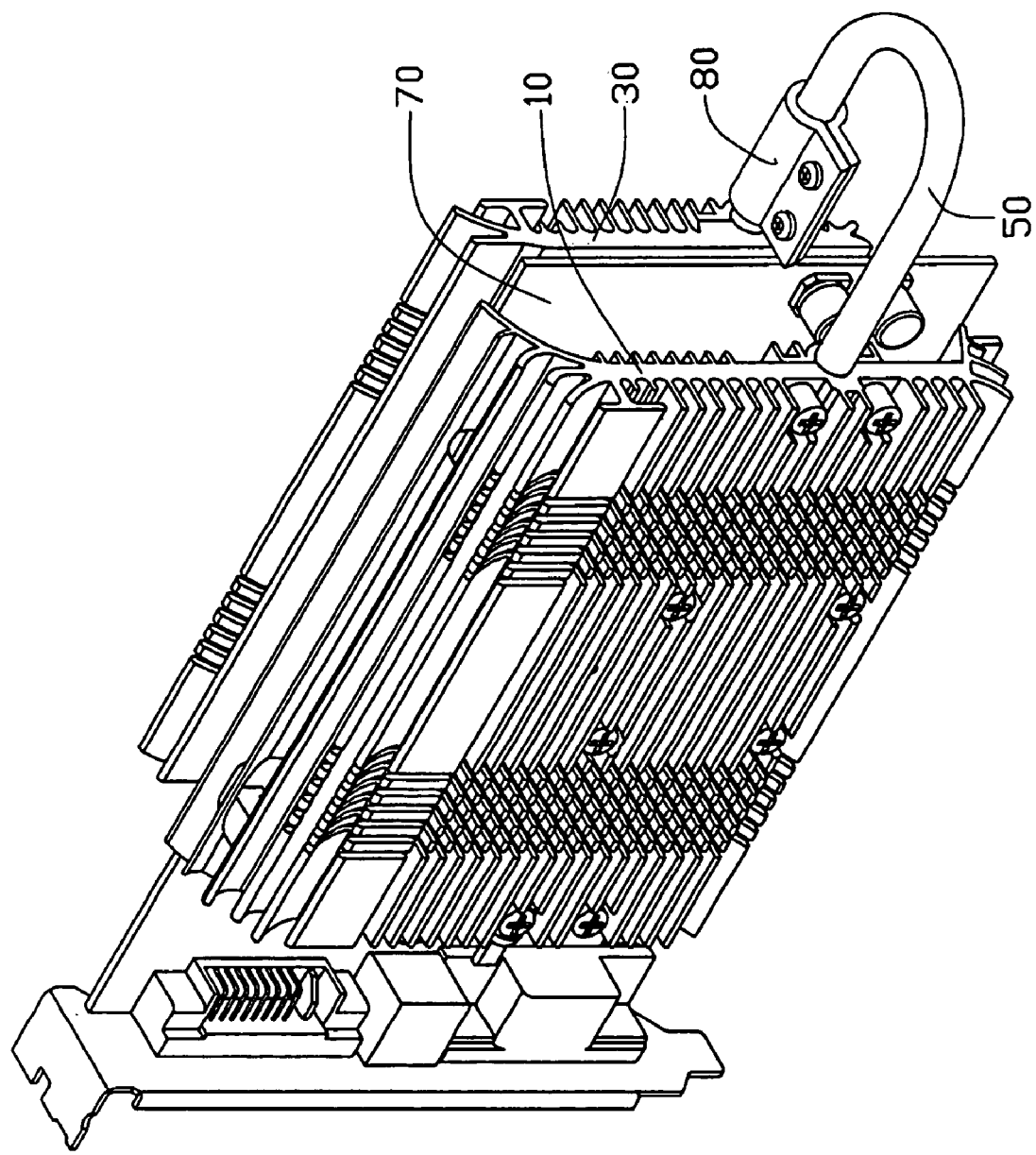
FIG. 3 is an asssembled view the heat dissipation device of FIG. 1.

Referring to FIG. 3, in assembly, the block 20 and the combined second heat sink 30 and second heat pipe 60 are respectively attached to opposite sides of the circuit board 72 by screws (not labeled). The block 20 intimately contacts the GPU 74 for absorbing heat generated by the GPU 74. The second heat sink 30 is located at the opposite side of the circuti board 72. The combined first heat sink 10 and first heat pipe 50 is attached to the block 20 by screws (not labeled). The second heat pipe 60 is aligned with and contact one of the straight sections of the U-shaped end portion 52 of the first heat pipe 50. The connecting member 80 encloses adjacent ends of the first and second heat pipes 50, 60 and is fixed with the first and second heat pipes 50, 60 by screws 90. The first and second heat pipes 50, 60 cooperatively form a U-shaped profile.

Figure 4:
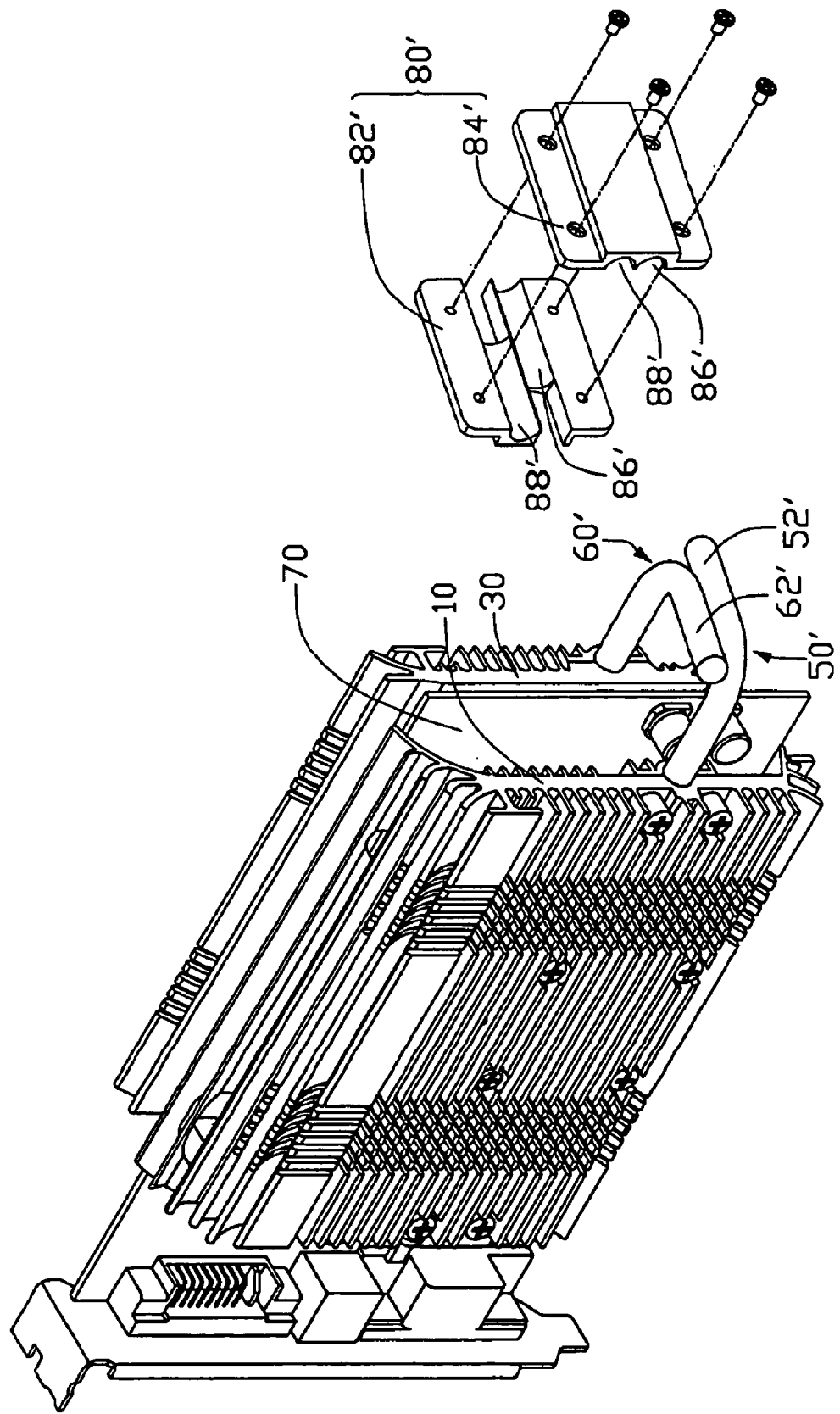
FIG. 4 is a partly exploded view of a heat dissipation device in accordance with a second preferred embodiment of the present invention, together with a VGA card.
Figure 5:
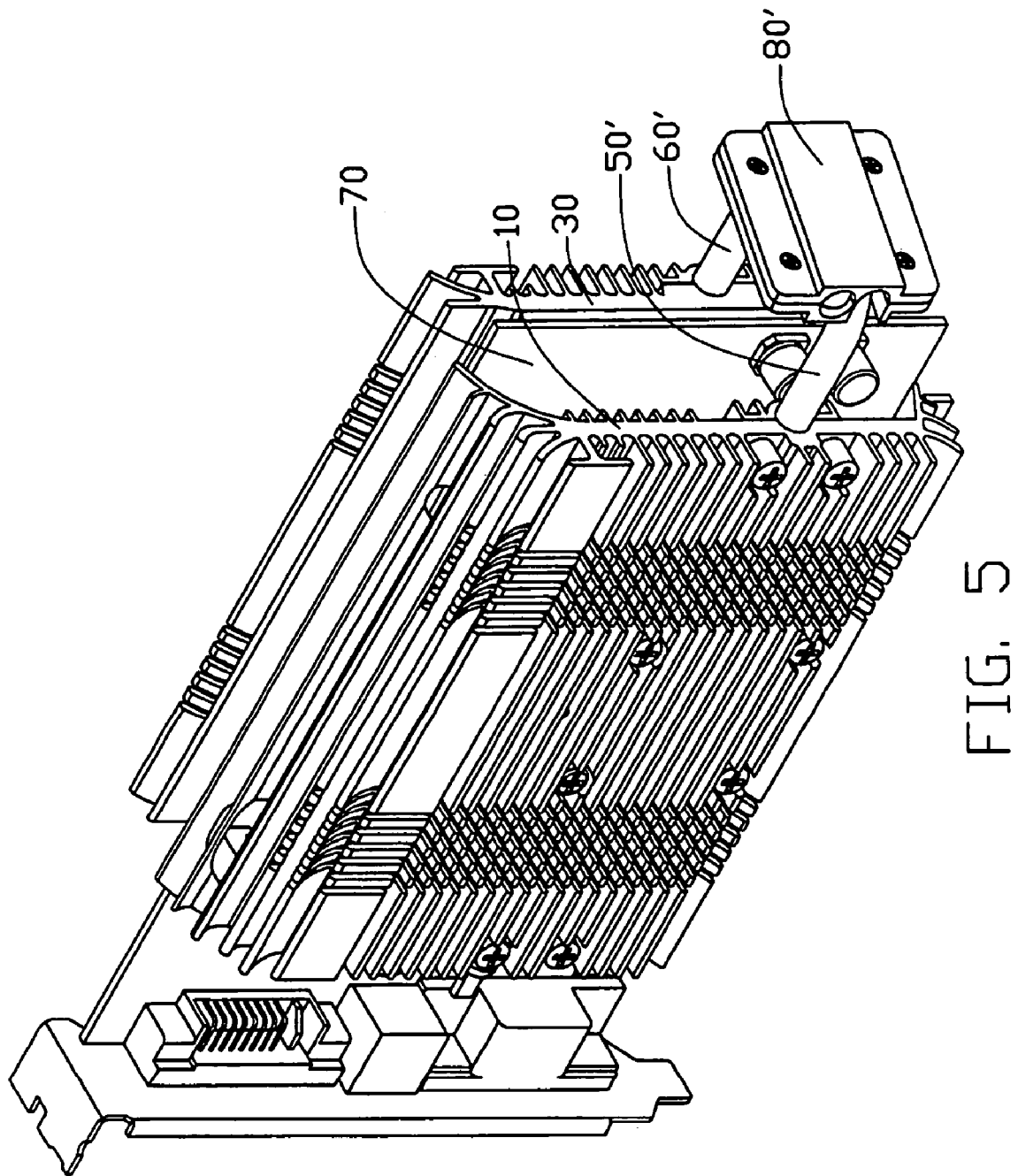
FIG. 5 is an asssembled view the heat dissipation device of FIG. 4.
Figure 6:
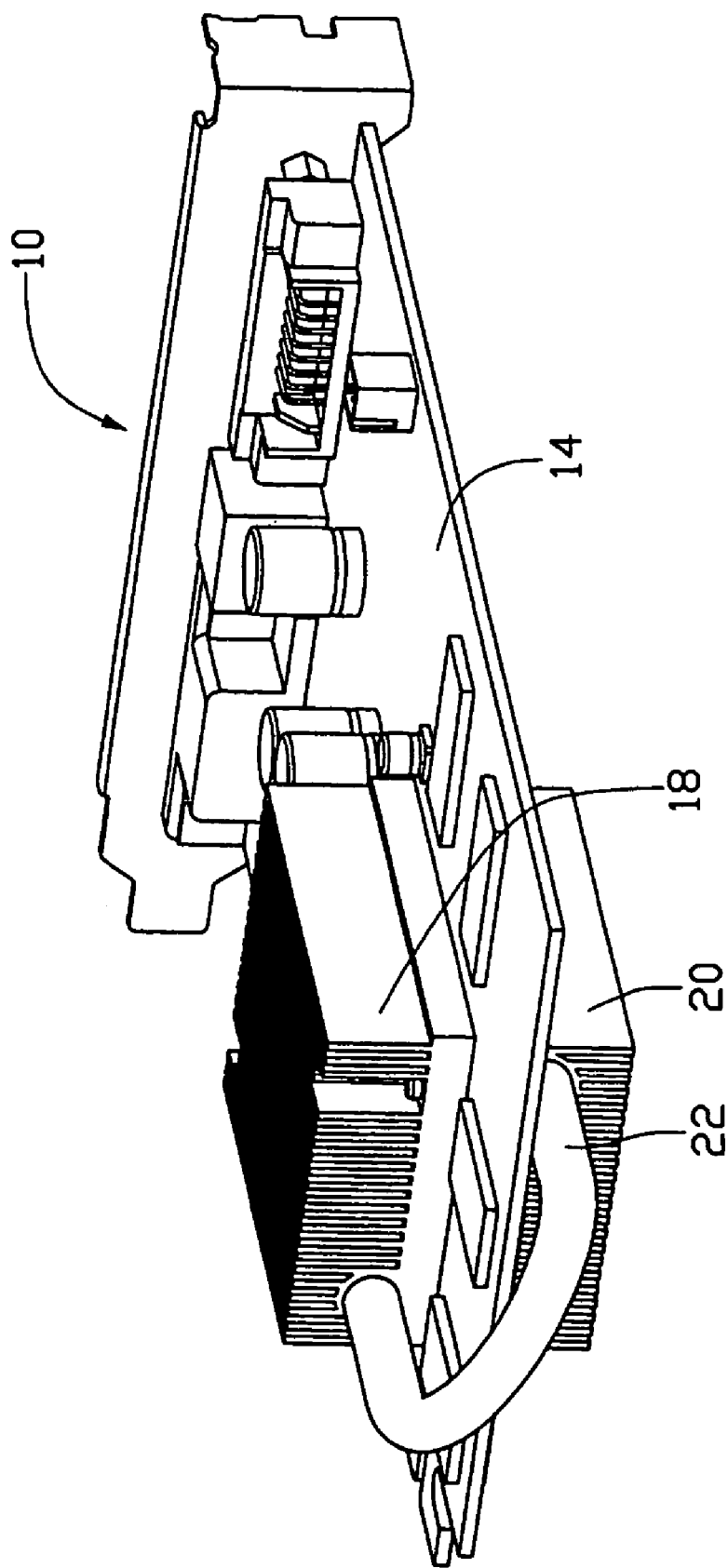
FIG. 6 is an isometric view of a conventional heat dissipation device mounted on a VGA card.

FIGS. 4–5 show a heat dissipation device in accordance with a second preferred embodiment of the present invention and a VGA card 70. The heat dissipation device of the second preferred embodiment is similar to the heat dissipation device of the first preferred embodiment except first and second heat pipes 50', 60' and a connecting member 80'. The first and second heat pipes 50', 60' both are L-shaped. Each heat pipe 50', 60' comprises a linear portion received in one of the first and second heat sinks 10, 30 and a bent portion 52', 62' extending beyond said one of the first and second heat sinks 10, 30. The connecting member 80' comprises two parts 82', 84' secured together by screws (not labeled). Each part 82', 84' defines a pair of slots 86', 88' corresponding to the bent portions 52', 62'. The slots 86' of the two parts 82', 84' cooperatively form a space receiving the bent portion 52' of the first heat pipe 50'. The slots 88' of the two parts 82', 84' cooperatively form a space receiving the bent portion 62' of the second heat pipe 60'.

In the present invention, each heat sink 10, 30 is secured with one heat pipe 50, 50', 60, 60'. The connecting member 80, 80' is connected between two heat pipes 50, 50', 60, 60' for transferring heat from one heat pipe 50, 50' to the other heat pipe 60, 60'. Thus, the heat pipe 50, 50', 60, 60' is readily secured to the heat sink 10, 30 than a heat pipe secured to two heat sink simulatenously in the conventional design. Furthermore, each heat sink 10, 30 is generally 120 mm and each heat pipe 50, 50', 60, 60' is shorter than 200 mm and can be therefore efficiently used. In the second preferred embodiment of the present invention, the distance between the two heat sinks 10, 30 is adjustable according to requirement of the card 70 by adjusting locations of the bent portions 52, 62 of the heat pipes 50', 60' in the slots 86, 88 of the connecting member 80'.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat dissipation device assembly comprising:
   a circuit board with an electronic component mounted thereon;
   a first heat dissipation unit provided on one side of the board in thermal contact with the electronic component;
   a second heat dissipation unit provided on an opposite side of the board;
   a first heat pipe connected to and thermally contacting the first heat dissipation unit;
   a second heat pipe discrete from the first heat pipe connected to and thermally contacting the second heat dissipation unit; and
   a connecting member connected between the first and second heat pipes for transferring heat from the first heat pipe to the second heat pipe.

2. The heat dissipation device assembly as claimed in claim 1, wherein the first heat pipe and the second heat pipe are isolated from and without flow communication with each other.

3. The heat dissipation device assembly as claimed in claim 2, wherein the first heat dissipation unit comprises a block contacting the electronic component and a heat sink secured on the block, the first heat pipe being secured to the heat sink and thermally contacting the block.

4. The heat dissipation device assembly as claimed in claim 3, wherein the first heat pipe has U-shaped end portion beyond the first heat sink, and the second heat pipe is linear-shaped.

5. The heat dissipation device assembly as claimed in claim 4, wherein the connecting member securely encloses adjacent two ends of the first and second heat pipes to cause the first and second heat pipes to cooperatively form a U profile.

6. The heat dissipation device assembly as claimed in claim 2, wherein the first and second heat pipes each has a generally L-shaped profile, and comprises a linear portion received in one of the first and second heat sinks, and a bent portion extending beyond said one of the first and second heat sinks.

7. The heat dissipation device assembly as claimed in claim 6, wherein the connecting member defines a pair of spaces receiving the bent portions therein respectively.

8. The heat dissipation device assembly as claimed in claim 6, wherein the connecting member comprises discrete first and second parts, each of the first and second parts defining a pair of slots and each of the spaces being fromed by one slot of the first part cooperativing with one slot of the second part.

9. A heat dissipation device for a circuit board comprising:
   a first heat dissipation unit adapted for being attached to one side of the circuit board;
   a first heat pipe thermally connected with the first dissipation unit;
   a second heat pipe discrete and isolated from the first heat pipe;
   a connecting member connecting the first heat pipe with the second heat pipe for transferring heat from the first heat pipe to the second heat pipe; and
   a second heat dissipation unit for cooling the second heat pipe.

10. The heat dissipation device as claimed in claim 9, wherein the first heat dissipation unit comprises a block contacting the electronic component and a first heat sink secured on the block, the first heat pipe being secured to the heat sink and thermally contacting the block.

11. The heat dissipation device as claimed in claim 10, wherein the second heat dissipation unit comprises a second heat sink adapted for being attached to an opposite side of the circuit board.

12. The heat dissipation device as claimed in claim 11, wherein the connecting member securely encloses adjacent two ends of the first and second heat pipes to cause the first and second heat pipes to cooperatively form a U profile.

13. The heat dissipation device as claimed in claim 10, wherein the heat pipes are L-shaped, and the connecting member encloses adjacent ends of the heat pipes.

* * * * *